(12) United States Patent
Hellström et al.

(10) Patent No.: US 9,685,753 B2
(45) Date of Patent: Jun. 20, 2017

(54) TUNABLE OPTICAL PARAMETRIC OSCILLATOR

(71) Applicant: COBOLT AB, Solna (SE)

(72) Inventors: Jonas Hellström, Solna (SE); Peter Jänes, Solna (SE)

(73) Assignee: COBOLT AB, Solna (SE)

( * ) Notice: Subject to any disclaimer, the term of this patent is extended or adjusted under 35 U.S.C. 154(b) by 24 days.

(21) Appl. No.: 14/894,686

(22) PCT Filed: May 26, 2014

(86) PCT No.: PCT/EP2014/060855
§ 371 (c)(1),
(2) Date: Nov. 30, 2015

(87) PCT Pub. No.: WO2014/191365
PCT Pub. Date: Dec. 4, 2014

(65) Prior Publication Data
US 2016/0111848 A1    Apr. 21, 2016

(30) Foreign Application Priority Data

May 31, 2013 (SE) ..................... 1350669

(51) Int. Cl.
| | | |
|---|---|---|
| *H01S 3/10* | (2006.01) | |
| *H01S 3/04* | (2006.01) | |
| *H01S 3/093* | (2006.01) | |
| *H01S 3/108* | (2006.01) | |
| *H01S 3/131* | (2006.01) | |
| *H01S 3/102* | (2006.01) | |
| *H01S 5/06* | (2006.01) | |
| *H01S 3/08* | (2006.01) | |

(Continued)

(52) U.S. Cl.
CPC ............... *H01S 3/108* (2013.01); *G02F 1/39* (2013.01); *H01S 3/08036* (2013.01);
(Continued)

(58) Field of Classification Search
CPC ...... H01S 3/108; H01S 5/0612; H01S 3/1028; H01S 3/08036; H01S 3/1083;
(Continued)

(56) References Cited

U.S. PATENT DOCUMENTS

2008/0240177 A1* 10/2008 Karlsson .............. G02F 1/3532
                                                                    372/21
2009/0268763 A1* 10/2009 Hellstrom .............. H01S 3/109
                                                                    372/22

(Continued)

FOREIGN PATENT DOCUMENTS

| EP | 0 857 997 A2 | 8/1998 |
|---|---|---|
| WO | WO 2006/078716 A2 | 7/2006 |
| WO | WO 2006/135318 A1 | 12/2006 |

OTHER PUBLICATIONS

International Search Report (PCT/ISA/210) dated Aug. 11, 2014 by the International Searching Authority for International Application No. PCT/EP2014/060855.

(Continued)

*Primary Examiner* — Yuanda Zhang
(74) *Attorney, Agent, or Firm* — Buchanan Ingersoll & Rooney P.C.

(57) ABSTRACT

A new principle for a tunable optical parametric oscillator (OPO) and a related method are disclosed. An OPO is tuned by setting the temperature of a non-linear element to select a desired signal/idler combination, and narrow-band operation is effected by tuning a birefringent filter in the OPO to a temperature setting at which the filter matches the selected signal/idler combination, wherein broad and stable tunability is obtained by virtue of at least two different temperature settings of the non-linear element being matched to a single common temperature setting of the birefringent filter.

11 Claims, 4 Drawing Sheets

(51) Int. Cl.
*G02F 1/39* (2006.01)
*H01S 5/10* (2006.01)
*H01S 5/14* (2006.01)

(52) U.S. Cl.
CPC .......... *H01S 3/1028* (2013.01); *H01S 3/1083* (2013.01); *H01S 3/1317* (2013.01); *H01S 5/0612* (2013.01); *G02F 2203/05* (2013.01); *H01S 5/10* (2013.01); *H01S 5/14* (2013.01)

(58) Field of Classification Search
CPC . H01S 3/1317; H01S 5/10; H01S 5/14; G02F 1/39; G02F 2203/05
See application file for complete search history.

(56) References Cited

U.S. PATENT DOCUMENTS

| | | | |
|---|---|---|---|
| 2010/0315698 A1 | 12/2010 | Dixon | |
| 2014/0003455 A1* | 1/2014 | Bereczki | H01S 5/0092 372/22 |

OTHER PUBLICATIONS

International Preliminary Report on Patentability (PCT/IPEA/409) dated Aug. 24, 2015 by the International Preliminary Examining Authority for International Application No. PCT/EP2014/060855.
Tukker et al., "A narrow-bandwidth optical parametric oscillator", Optics Communications, Aug. 1998, pp. 83-86, vol. 154, No. 1-3.
O'Connor et al., "Use of a birefringent filter for tuning a synchronously pumped optical parametric Oscillator", Applied Physics B: Lasers and Optics, May 2004, pp. 15-23, vol. 79, No. 1.
Lenhard et al., "Highly Stable Diode-laser pumped, Idler Resonant CW OPO based on MgO:PPLN", Conference on Lasers and Electro-Optics (CLEO) and Quantum Electronics and Laser Science Conference (QELS), May 2010, pp. 1-2.
Vodopyanov et al., "Optical parametric oscillation in quasi-phasematched GaAs", Optics Letters, Aug. 2004, pp. 1912-1914, vol. 29, No. 16.
Bosenberg et al., "Continuous-wave singly resonant optical parametric oscillator based on periodically poled $LiNbO_3$" Optics Letters, May 1996, pp. 713-715, vol. 21, No. 10.

* cited by examiner

TUNABLE OPTICAL PARAMETRIC OSCILLATOR

TECHNICAL FIELD

The present invention relates to optical parametric oscillators (OPO's), and more particularly to tunable OPO's.

BACKGROUND

OPO's have been known for many years and are widely used for generating coherent radiation in the near/mid IR region around 1-5 µm.

One example of a tunable OPO is described by Walter Bosenberg et al. in "Continuous-wave singly resonant optical parametric oscillator based on periodically poled LiNbO$_3$", Optics Letters, vol. 21, no. 10, May 15, 1996 (Bosenberg). By using a Nd:YAG pump laser emitting at 1064 nm, Bosenberg demonstrated an OPO based on periodically poled LiNbO$_3$ that could be tuned over 1.54-1.61 µm (signal) and 3.41-3.14 µm (idler) by varying the temperature of the periodically poled LiNbO$_3$ over 110-220° C.

Prior art OPO's have been limited by narrow tuning range, complex construction and/or poor spectral quality.

SUMMARY

An object of the present invention is to provide a narrow-band, broadly tunable OPO substantially without moving parts. Particularly, the invention relates to tunable nanosecond OPO's for generating an output in the mid IR range of about 2-5 µm useful for, inter alia, gas sensing applications. Comparatively broad tunability without using moving parts is achieved according to the present invention by means of a novel temperature tuning scheme and narrow-band emission is achieved by an inventive use of birefringent filters in singly resonant OPO's.

Before going into details about embodiments of the present invention, an introduction will be given to facilitate understanding of the present invention.

An optical parametric generator converts a pump beam of frequency $\omega_p$ into a signal beam of frequency $\omega_s$ and an idler beam of frequency $\omega_i$, such that $\omega_p = \omega_s + \omega_i$. When the optical parametric generator is positioned in a resonant cavity to provide feedback to the parametric process, an optical parametric oscillator, OPO, is formed. In an OPO, either one of the signal and idler beams can be resonant or both the signal and idler beams can be resonant. The former case is called a singly resonant OPO, while the latter is called a doubly resonant OPO. A doubly resonant OPO will generally be more efficient than a singly resonant OPO due to the stronger feedback to the parametric process. However, a doubly resonant OPO is also more prone to stability issues and for practical reasons, a singly resonant OPO may often be preferred.

The parametric gain of the non-linear process must overcome cavity losses in order for oscillation to occur. Just as for a laser, the oscillating field can thus be controlled by controlling the gain and/or the losses of the cavity.

The gain of the parametric process is primarily determined by non-linearity of the non-linear element and phase-matching conditions. According to the present invention, it is preferred to use a quasi-phasematching crystal for the parametric process, and to control the phase-matching conditions by means of the temperature of the crystal.

A particularly preferred type of non-linear crystal for the parametric process is periodically poled non-linear crystals, such as periodically poled lithium niobate (PPLN). For the periodically poled crystal, a period is selected for generation of a combination of signal and idler beams roughly in the middle of a desired tuning range at a temperature similarly in the middle of an available range of operating temperatures for the crystal. By tuning the temperature of the crystal, thermal expansion of the crystal and temperature dependence of refractive index cause tuning of the phase-matching conditions of the periodically poled crystal. Typically, the crystal can conveniently be tuned over a temperature range of at least 50 degrees, for example between 10° C. and 70° C., although much wider temperature tuning can be allowed depending on the circumstances and design.

Use of a birefringent filter for tuning a synchronously pumped optical parametric oscillator has been described by O'Connor et al. (Appl. Phys. B, 79, 15-23, published online on 5 May 2004). While relating specifically to syncronously pumped OPO's, some basic characteristics of birefringent filters can be found therein.

In order to make the generated radiation narrow-band, embodiments of the present invention make use of a birefringent filter of Lyot type arranged inside the resonant cavity of the OPO. This birefringent filter comprises a birefringent crystal and a polarizing element, which give rise to a series of transmission peaks. The transmission peaks are separated in wavelength by a free spectral range (FSR), given for a one-stage filter of Lyot-type by:

$$\Delta\lambda = \frac{\lambda^2}{(n_e - n_o)L}, \quad (1)$$

where $\Delta\lambda$ is the FSR; $\lambda$ is the wavelength of the beam passing through the crystal; $n_e$ and $n_o$ are the extraordinary and ordinary refractive indices, respectively; and L is the length of the birefringent crystal.

As will be appreciated, the combined polarization state of a light beam after having passed through the birefringent element will be determined by the phase difference $\Delta\phi$ introduced between the ordinary and extraordinary beams:

$$\Delta\varphi = \frac{2\pi L}{\lambda}(n_e - n_o), \quad (2)$$

where transmission peaks are obtained by means of the polarizing element for a multiplicity of wavelengths that evaluate equation (2) to an integer times $2\pi$.

Consider now a situation where the birefringence $n_e - n_o = \Delta n_{eo}$ depends on temperature. By changing the temperature of the birefringent element, it is then possible to shift the wavelength position of the transmission peaks. The larger $\Delta n_{eo}$ is, the larger the tunability of the filter becomes.

In a practical implementation of a narrow-band OPO, the FSR should be sufficiently large, which is determined by the length L of the birefringent element and the magnitude of $\Delta n_{eo}$. At the same time, in order to provide tunability, the change of $\Delta n_{eo}$ with temperature, $d/dT(\Delta n_{eo})$, should be non-zero.

From a tunability point of view, the magnitude of $d/dT(\Delta n_{eo})$ should be as large as possible. However, it has been found that maximizing the magnitude of $d/dT(\Delta n_{eo})$ could increase the temperature sensitivity of the filter such that an unstable output is obtained. Therefore, a comparatively low temperature dependence of the birefringent filter is used in embodiments of the present invention to improve the wavelength stability of the output.

In order to obtain narrow-band output, it may be advantageous if only one of the transmission peaks of the birefringent filter overlap with the gain of the non-linear crystal. This means that the FSR of the birefringent filter could preferably be at least as large as the gain width of the non-linear crystal.

In preferred embodiments of the present invention, generation of a desired combination of signal and idler waves is selected by tuning the non-linear element to a corresponding temperature setting. Preferably, the OPO is singly resonant for the signal beam, while the idler beam is extracted as an output from the OPO. The generated radiation is made narrow-band by tuning the birefringent filter to a temperature setting at which a transmission peak of the filter is matched to the selected combination of signal and idler beams. Typically, the birefringent filter acts on the resonant beam. According to the invention, different transmission peaks of the filter are used during tuning, so that at least two different temperature settings for the non-linear element are matched to a single common temperature setting of the birefringent filter.

Generally, it is desired to keep the tuning rate of the birefringent filter comparatively low in order to avoid excess instabilities due to small temperature fluctuations. To this end, the tuning rate, measured as wavelength shift per unit temperature (nm/K), is at least twice as large for the non-linear element as for the birefringent filter. In absolute terms, the tuning rate of the birefringent filter is preferably less than 0.2 nm/K, or even less than 0.15 nm/K.

In embodiments of the present invention, both the non-linear element and the birefringent filter preferably have a temperature tuning range of at least 30° C., more preferably at least 50° C. For example, the non-linear element and/or the birefringent filter could be tunable between 10° C. and 70° C.

BRIEF DESCRIPTION OF THE DRAWINGS

The invention will be described in more detail below with reference to the accompanying drawings, on which.

DETAILED DESCRIPTION

A preferred embodiment of the present invention is an OPO that comprises a periodically-poled non-linear element for converting a pump beam into a signal and an idler beam. The parametric gain of the non-linear element is temperature-dependent, such that different combinations of signal and idler beams are generated from the pump beam at different operating temperatures of the non-linear element. In order to make the OPO output narrow-band, a birefringent filter of Lyot type is provided in the OPO cavity. The birefringent filter comprises a birefringent element and a polarizing element, and tunability of the filter is obtained by virtue of a temperature-dependent birefringence in the birefringent element. By tuning the temperature of the birefringent element, transmission peaks of the filter can be shifted in wavelength.

When the non-linear element is tuned during operation to provide a desired combination of signal and idler beams, the birefringent filter is tuned simultaneously to ensure that a transmission peak of the filter matches to the generated signal beam (or, alternatively, the idler beam).

It has been understood, however, that the temperature dependence of the birefringent filter should be kept comparatively low in order to avoid instabilities due to small temperature fluctuations. In practise, the temperature dependence of the filter needs to be so small that it becomes practically impossible to follow the signal beam over the entire tuning range of the non-linear element. Therefore, a tuning scheme has been implemented in which the filter is switched from one transmission peak to another, while at the same time the temperature thereof is adjusted to remain within a desired operating range.

Preferably, the non-linear element is a periodically poled crystal of lithium niobate, PPLN, and the birefringent element is a crystal of potassium-titanyl-phosphate, KTP. It is generally known in the art, per se, how to structure and assemble a non-linear element such as PPLN for parametric generation and a birefringent filter.

Figure 1:
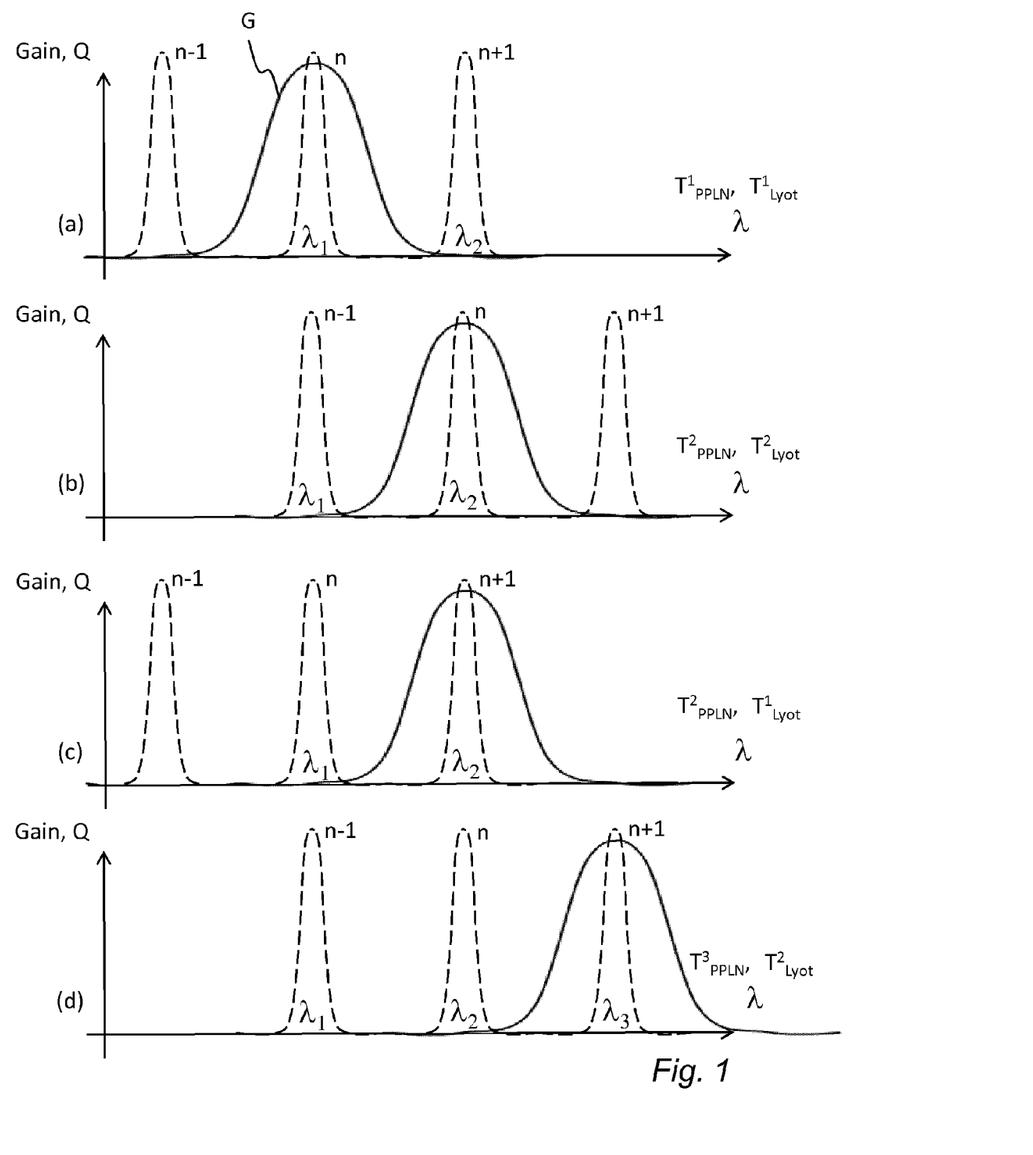
FIG. 1 shows a series of graphs illustrating the inventive temperature tuning scheme according to the invention.

The tuning scheme according to the present invention is schematically shown in FIG. 1, in which a series of graphs are presented. The gain of the PPLN is illustrated by a solid curve at G, while transmission peaks of the Lyot filter are shown as dashed curves. In order not to reduce the intelligibility of the graphs, only three transmission peaks (labeled n−1, n, and n+1) are shown, although it will be readily understood that the Lyot filter exhibits a repeated pattern of a very large number of transmission peaks.

In graph (a), the temperature of the PPLN, $T_{PPLN}$, is equal to $T^1_{PPLN}$ and the temperature of the birefringent element, $T_{Lyot}$, is equal to $T^1_{Lyot}$. At this combination of $T_{PPLN}$ and $T_{Lyot}$, the gain curve overlaps with a transmission peak labeled n at wavelength $\lambda_1$, which thus will oscillate in the OPO. The OPO can now be tuned by simultaneously varying the temperatures of the PPLN and of the birefringent element of the Lyot filter. However, since the temperature tuning rate of the Lyot filter is low compared to that of the PPLN, only a limited portion of the PPLN tuning range can be reached using the transmission peak labeled n. Graph (b) illustrates a situation where the temperature $T_{Lyot}$ of the birefringent element has reached a limit $T^2_{Lyot}$ providing an oscillating wave in the OPO at wavelength $\lambda_2$. In order to provide broader tuning range, when the temperature $T_{Lyot}$ of the birefringent element has reached its limits, a switch is made to another transmission peak, as illustrated in graph (c), where oscillation at $\lambda_2$ is still obtained in the OPO but at another temperature of the birefringent filter using another transmission peak (labeled n+1). In the situation illustrated in graph (c), the temperature of the birefringent element has been tuned back to $T^1_{Lyot}$ towards the other end of the birefringent filter temperature tuning range (here arbitrarily chosen to be the same temperature as for graph (a), but it could of course be any other temperature), but now the transmission peak labeled n+1 overlaps the gain curve of the PPLN. From the situation illustrated in graph (c), it is possible to further tune the temperature of the PPLN and of the birefringent filter to reach a broader tuning range, as illustrated in graph (d) where an oscillation in the OPO is obtained at wavelength $\lambda_3$. It may help the understanding of this by considering $T^1_{Lyot}$ as being close to the lower end of the available temperature tuning range, and $T^2_{Lyot}$ as being close to the upper end of the available temperature tuning range for the birefringent filter. In other words, for at least one wavelength, a first transmission peak is matched at a first temperature of the birefringent element and a second transmission peak is matched at a second temperature of the birefringent element.

Using this tuning scheme, a broadly tunable OPO can be provided while avoiding moving parts for the tuning and while keeping temperature sensitivity of the filter sufficiently low to provide a stable narrow-band output.

Generally, during tuning from one output wavelength to another, it is preferred that the temperatures of the birefringent filter and the non-linear element are maintained correlated in order for a well defined output wavelength to be generated throughout the tuning event, causing the inventive OPO to effectively perform a wavelength scan from the initial wavelength setting to the final wavelength setting. This will be described in more detail below with reference to FIG. 5.

Figure 2:
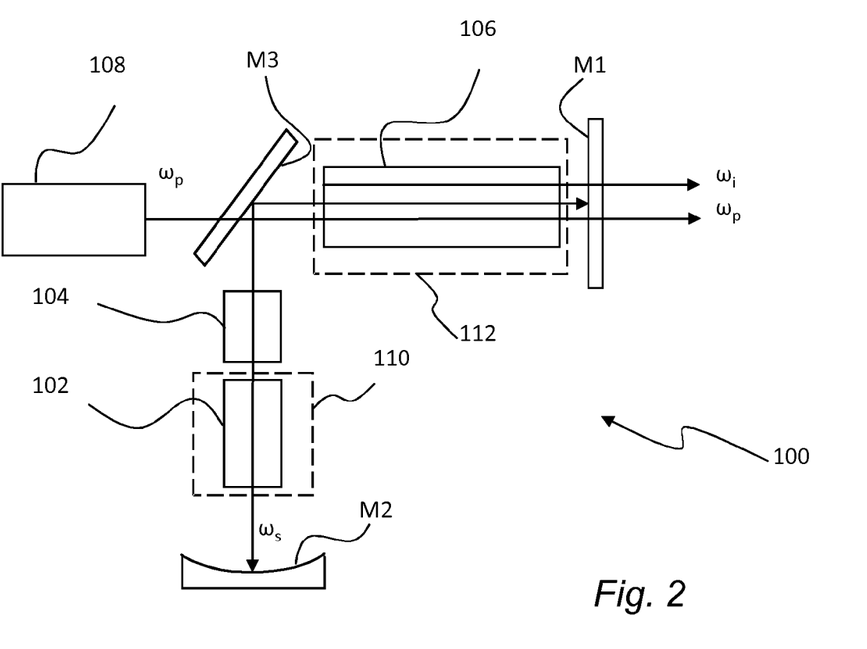
FIG. 2 schematically shows an OPO according to the present invention.

FIG. 2 schematically shows an OPO 100 according to the present invention. A pump laser 108 provides a pump beam at frequency $\omega_p$ that is launched into a resonant cavity, which is defined by a first mirror M1, a second mirror M2, and a third mirror M3. In a first branch of the cavity, there is arranged a non-linear element 106 for converting the pump beam of frequency $\omega_p$ into a signal beam of frequency $\omega_s$ and an idler beam of frequency $\omega_i$. In a second branch of the cavity, there is arranged a birefringent element 102. The third mirror M3 constitutes a folding mirror that separates the two branches of the cavity, and the pump beam is launched into the cavity through this mirror M3.

In the non-linear element 106, the signal and idler beams are generated collinearly with the pump beam, and the idler beam is extracted from the cavity through the first mirror M1 as an output of the OPO, while the signal beam is resonant in the cavity. As indicated in FIG. 2, the second mirror M2 is a curved mirror to provide a stable cavity.

The birefringent element 102 is arranged in thermal contact with a temperature controller 110 that is used for controlling the temperature of the birefringent element. Similarly, the non-linear element 106 is also arranged in thermal contact with a temperature controller 112 for controlling the temperature of the non-linear element. Typically, the operating temperatures of the non-linear element and the birefringent element are different, so the temperature controllers 110 and 112 are thermally separate from each other.

As explained above, a birefringent filter of Lyot type requires both a birefringent element and a polarizing element. In preferred embodiments of the present invention, the folding mirror M3 constitutes also the polarizing element of the filter. By proper design of the mirror M3, sufficient polarization discrimination can be obtained in reflection in order to form a Lyot filter in combination with the birefringent element 102. Generally, it is preferred to keep the number of intra-cavity elements as low as possible, and for this reason it may be beneficial to let the folding mirror M3 constitute the polarizing element of the Lyot filter. However, it is also a feasible alternative to introduce a separate polarizing element 104, such as a Brewster plate, although this is purely optional when sufficient polarization discrimination can be obtained by the mirror M3.

One embodiment of the present invention is an OPO that provides an output idler beam around 3450 nm. The OPO is pumped by a passively Q-switched Nd:YAG pump laser 108 emitting a pump beam at 1064 nm. The non-linear element is a crystal of PPLN having a periodic poling suitable for generating a signal beam around 1540 nm and an idler beam around 3450 nm at room temperature when pumped at 1064 nm.

The OPO is singly resonant for the signal beam, and the output idler beam is made narrow-band by forcing the resonant signal beam to oscillate in a narrow band by means of the birefringent filter in the cavity. The birefringent element 102 is a 6 mm long crystal of KTP and the folding mirror M3 constitutes the polarizing element of the birefringent filter (hence no separate Brewster plate). The KTP crystal is mounted on a first thermoelectric element 110, and the PPLN is mounted on a second thermoelectric element 112, as shown by the dashed lines in FIG. 2.

Figure 3:
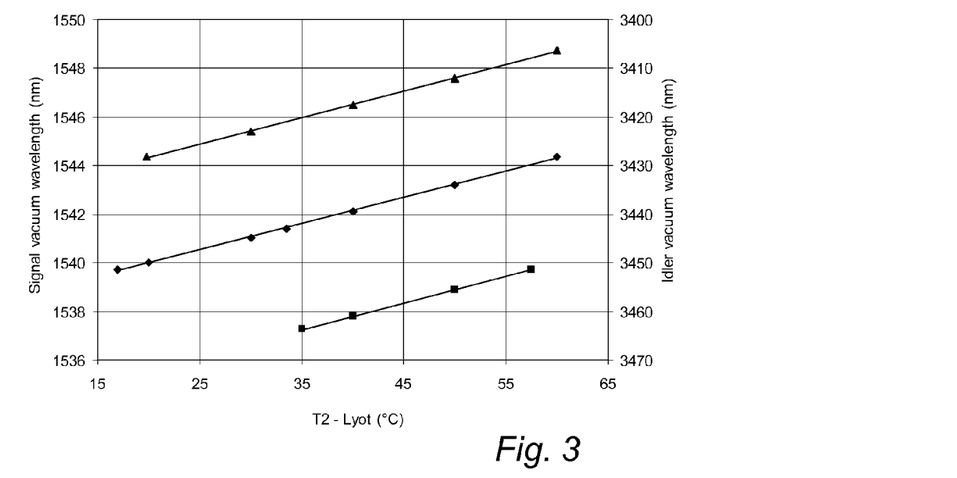
FIG. 3 shows a graph over measured tunability of the birefringent filter.

FIG. 3 is a graph showing measured tunability of this birefringent filter. It can be seen that the tuning rate is about 0.11 nm/K (note that the filter in this case acts on the resonant signal beam). During measurements, it was noted that only every second transmission peak of the birefringent filter should be used, in order to obtain a large side-mode suppression ratio. The reason for this is not entirely understood at present, but could be due to formation of superimposed "ghost cavities" caused by non-perfect coatings of the optical surfaces in the cavity, or it could possibly be associated with the double-pass of the resonant signal beam through the KTP crystal in some way. At any rate, it should be understood that the measurements shown in FIG. 3 were made while skipping every second transmission peak of the birefringent filter, so while the wavelength difference between the tuning curves shown in the figure is about 4.2 nm, the actual FSR of the filter was about 2.1 nm.

Figure 4:
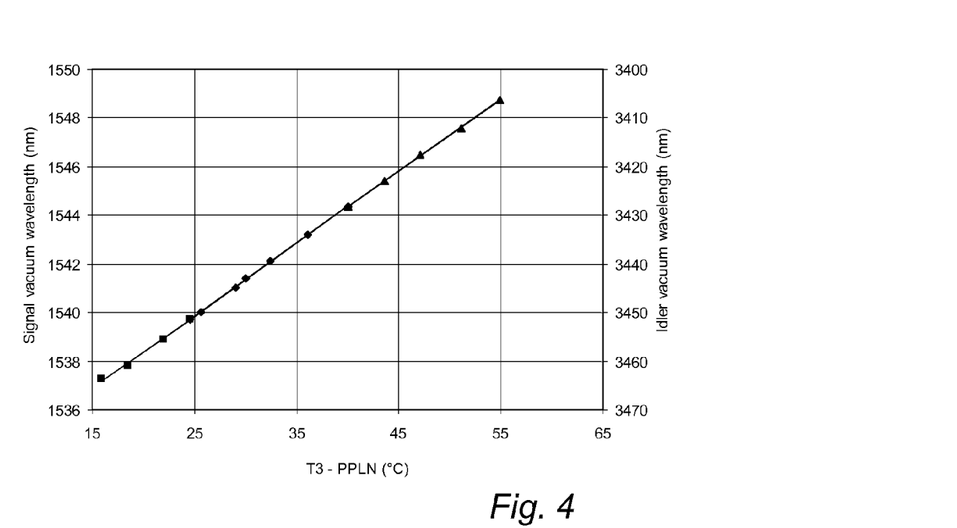
FIG. 4 shows a graph over measured tunability of the non-linear crystal.

FIG. 4 is a graph showing measured tunability of the PPLN 106. As can be seen, for a temperature tuning range from about 15° C. to about 55° C. the signal beam wavelength is tuned from about 1537 nm to about 1549 nm, corresponding to an idler beam wavelength from about 3465 nm to about 3405 nm (note that the idler and signal beams tune in opposite wavelength directions).

In order to tune the wavelength of the OPO while keeping the output narrow-band, the gain of the PPLN crystal needs to be synchronously tuned with the birefringent filter. From FIG. 4 it can be seen that the PPLN crystal tunes at a rate of about 0.29 nm/K (i.e. much faster than the birefringent filter, which tunes at a rate of about 0.11 nm/K). Since the tunability of the birefringent filter is smaller than that of the PPLN gain, different transmission peaks of the birefringent filter are used in order to take advantage of the full tuning range of the PPLN. This is clearly seen in FIG. 3, where the wavelength tuning is divided into three separate tuning ranges. When the KTP reaches the limits of the allowed temperature range, but the PPLN can be tuned further, another transmission peak of the birefringent filter is selected and the KTP temperature is adjusted correspondingly. As will be appreciated, this tuning scheme for the birefringent filter over different transmission peaks in order to reach the entire tuning range of the PPLN is advantageous for all birefringent filters that have a tuning rate that is smaller than that of the non-linear crystal gain. Again, from a wavelength stability point of view, it is beneficial to have a tuning rate for the birefringent filter that is not too high, and preferably the tuning rate is less than about 0.2 nm/K and most preferably less than about 0.15 nm/K.

When tuning from one output wavelength to another, target temperatures of the birefringent filter and the non-linear element are set according to a lookup table generated previously during calibration of the OPO. The lookup table correlates output wavelengths with the corresponding combination of temperatures for the birefringent filter and the non-linear element. When tuning to a specific output wavelength, the appropriate temperatures are interpolated from the data contained in the lookup table.

A wavelength tuning event can take place by the temperatures of the birefringent filter and the non-linear element being tuned to their respective target temperature individually and as fast as possible. When the target temperatures have been reached and a stable output is generated, an indication is typically given to the effect that a reliable output at the new wavelength is being generated.

Figure 5:
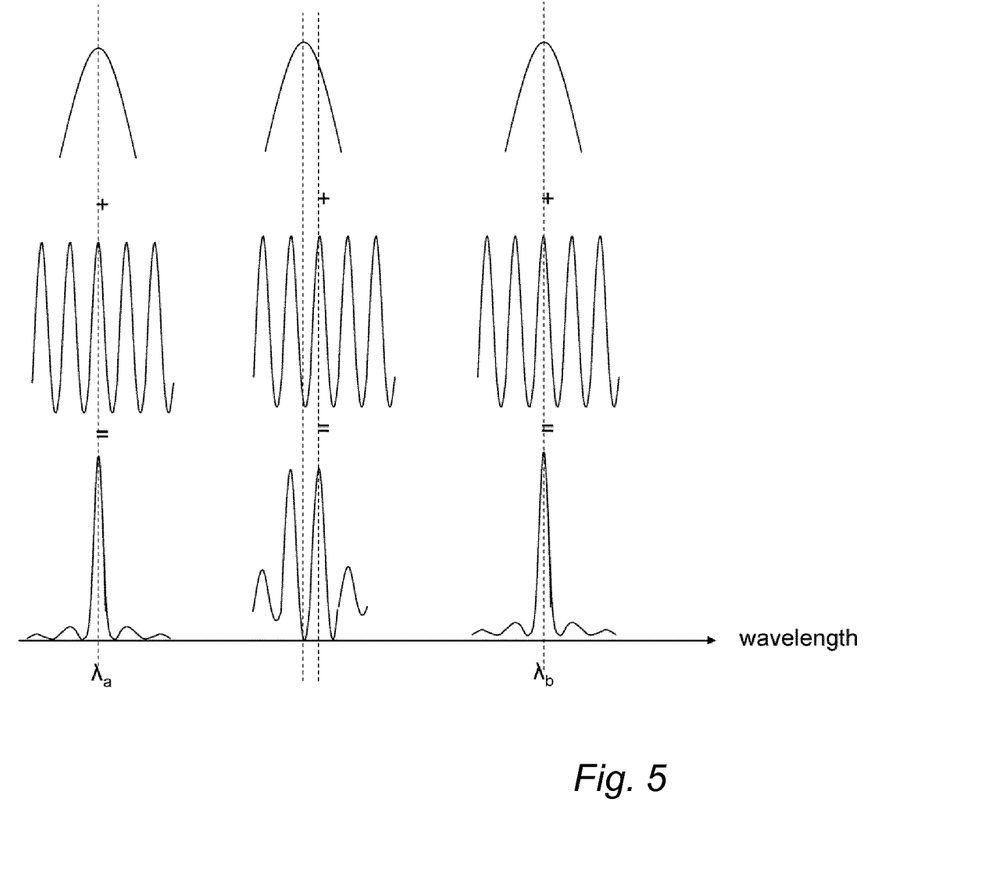
FIG. 5 schematically shows a tuning event from output wavelength $\lambda_a$ to $\lambda_b$.

However, during the actual tuning event, the output wavelength from the OPO is typically noisy and poorly defined since the matching between the birefringent filter and the non-linear element is not restored until the target temperatures have stabilized. This is schematically illustrated in FIG. 5, which shows a tuning event from output wavelength $\lambda_a$ to $\lambda_b$. At the initial wavelength setting, the output wavelength is $\lambda_a$ and there is correlation between the temperatures of the birefringent filter and the non-linear element that provides said output wavelength. However, during a tuning event, the correlation between the temperatures of the birefringent filter and of the non-linear element can be lost, to the effect that the output is noisy and poorly defined as illustrated in FIG. 5. Once the temperature of both the birefringent filter and of the non-linear element have stabilized at the final wavelength setting, a well-defined output wavelength is again obtained, now at $\lambda_b$.

In order to avoid this noisy and poorly defined output during a tuning event, another tuning algorithm may be preferred in some cases, in which the temperatures are maintained correlated throughout the tuning event, such that a well defined output wavelength is obtained also during tuning from the initial wavelength setting to the final wavelength setting. Effectively, this allows a well defined scan of wavelengths during a tuning event. The tuning speed will be determined by the "slowest" of the two elements, typically the element having the largest thermal mass. In most embodiments of the present invention, the non-linear element will have the largest thermal mass, which means that the temperature of the birefringent filter will have to follow that of the non-linear element. The exact position of the wavelength peak is determined by the birefringent filter and an advantageous benefit is thus that the instantaneous wavelength peak of the OPO during a tuning event can be read out from the temperature of the birefringent filter. It is also possible to implement different tuning behaviours that may be useful in different situations. For example, the tuning could be performed as quickly as possible to a target wavelength, which typically results in a non-linear "wavelength vs time" tuning, but still with a well defined output wavelength at each instant. Alternatively, it may be desired to have a wavelength scan between the initial setting and the final setting that is linear as a function of time, which will typically result in a slower tuning rate. The skilled person can implement this tuning behaviour in the temperature control algorithm in a straight forward manner once this description has been read and understood. As a concluding remark, it should be noted that the tuning described above that maintains a well defined output wavelength can be made within each continuous range of the birefringent filter, i.e. provided that a switch to another transmission peak is not required.

The OPO described above provided an output in the form of the idler beam at around 3435 nm with a tuning range of about 60 nm, while the bandwidth of the idler output was kept to less than about 1.5 nm. Thus, a very robust OPO with a broad tunability has been provided without using any moving parts and using a fixed pump beam wavelength.

It should be noted that the birefringent filter is arranged within the OPO resonant cavity, thus acting upon the resonant beam. In this preferred embodiment, the OPO is singly resonant for the signal beam and the filter is adapted to act upon the signal beam. However, as will be understood, the OPO could also be resonant for the idler beam, in which case the birefringent filter could act upon the idler beam; and either the signal or the idler beam could be extracted as an output.

It has been found that embodiments of the present invention behave with high predictability during temperature tuning. Temperature settings for the non-linear element and the birefringent filter corresponding to different output wavelengths can be stored in a look-up table, and a desired output wavelength from the OPO can be set by simply controlling the temperatures to appropriate settings, i.e. without using any feedback loop for the output wavelength. In some cases, however, it may still be advantageous to measure the generated output wavelength and provide feedback to control circuitry.

CONCLUSION

A new principle for a tunable optical parametric oscillator (OPO) and a related method are disclosed. An OPO is tuned by setting the temperature of a non-linear element to select a desired signal/idler combination, and narrow-band operation is effected by tuning a birefringent filter in the OPO to a temperature setting at which the filter matches the selected signal/idler combination, wherein broad and stable tunability is obtained by virtue of at least two different temperature settings of the non-linear element being matched to a single common temperature setting of the birefringent filter. The tuning rate measured as wavelength shift per unit temperature (nm/K) is larger, typically at least twice as large, for the non-linear element than for the birefringent filter.

The invention claimed is:

1. A method of tuning an optical parametric oscillator, OPO, in which
    different signal/idler beams combinations are selected by varying the temperature of a non-linear element in the OPO, one of said signal/idler beams being a selected resonant wavelength in said OPO, and
    narrow-band operation is effected by varying the temperature of a birefringent element in a birefringent filter in the OPO in order for a transmission peak of the birefringent filter to match the selected resonant wavelength;
    wherein at least two different selected resonant wavelengths obtained at two different temperatures of the non-linear element are matched by a transmission peak of the birefringent filter at a single temperature of the birefringent element; and
    wherein a first rate at which the resonant wavelength is shifted when varying the temperature of the non-linear element is larger than a second rate at which a transmission peak of the birefringent filter is shifted in wavelength when varying the temperature of the birefringent element.

2. The method of claim 1, wherein the birefringent element is tuned over a temperature range of at least 30° C.

3. The method of claim 1, wherein the non-linear element is tuned over a temperature range of at least 30° C.

4. The method of claim 1, wherein the first rate is at least twice as large as the second rate.

5. The method of claim 1, wherein the OPO is singly resonant for the signal beam, and the birefringent filter acts on the resonant signal beam.

6. The method of claim 1, wherein during a tuning event, temperatures of the birefringent element and of the non-linear element are maintained correlated such that a well-defined output is obtained during the tuning event.

7. A tunable optical parametric oscillator, OPO, comprising:
- a non-linear element operative to convert a pump beam of fundamental radiation into a signal beam and an idler beam, one of said signal and idler beams being a resonant wavelength in said OPO;
- a first temperature tuner controllable to adjust a temperature of the non-linear element for generation of a desired combination of signal and idler beams, and thereby select a resonant wavelength;
- a birefringent filter for at least one of the signal and idler beams, said birefringent filter comprising a birefringent element and a polarizing element;
- a second temperature tuner controllable to adjust a temperature of the birefringent element for matching a transmission peak of the birefringent filter with the selected resonant wavelength;
- wherein a tuning rate measured as wavelength shift per unit temperature (m/K) is at least twice as large for the non-linear element as for the birefringent filter.

8. The OPO of claim 7, wherein the birefringent filter has a tuning rate of less than 0.2 nm/K for the signal beam wavelength.

9. The OPO of claim 7, wherein the polarizing element of the birefringent filter is constituted by a cavity mirror of the OPO.

10. The OPO of claim 7, wherein the polarizing element of the birefringent filter is constituted by a Brewster plate arranged in the cavity of the OPO.

11. The OPO of claim 7, wherein said first and second temperature tuners are arranged to maintain temperatures of the birefringent filter and of the non-linear element correlated during a tuning event in order to provide a well-defined output during the tuning event.

* * * * *